US008913362B2

United States Patent
Simmonds

(10) Patent No.: US 8,913,362 B2
(45) Date of Patent: Dec. 16, 2014

(54) DIODE PROTECTION OF CASCODED MIXED-VOLTAGE TRANSISTORS

(75) Inventor: David Simmonds, Poway, CA (US)

(73) Assignee: Vixs Systems, Inc., Toronto (CA)

(*) Notice: Subject to any disclaimer, the term of this patent is extended or adjusted under 35 U.S.C. 154(b) by 75 days.

(21) Appl. No.: 13/488,518

(22) Filed: Jun. 5, 2012

(65) Prior Publication Data

US 2013/0321968 A1    Dec. 5, 2013

(51) Int. Cl.
*H02H 9/04* (2006.01)

(52) U.S. Cl.
USPC .......................................... 361/91.7; 361/91.1

(58) Field of Classification Search
USPC ................................................ 361/91.7, 91.1
See application file for complete search history.

(56) References Cited

U.S. PATENT DOCUMENTS

| 7,733,159 | B1* | 6/2010 | Camarota et al. ............. 327/534 |
| 2004/0212936 | A1* | 10/2004 | Salling et al. .................... 361/56 |
| 2005/0088242 | A1* | 4/2005 | Behzad ........................ 330/311 |
| 2006/0289937 | A1* | 12/2006 | Li et al. .......................... 257/362 |
| 2010/0090745 | A1* | 4/2010 | Kousai et al. ................. 327/355 |
| 2010/0103572 | A1* | 4/2010 | Worley ............................ 361/56 |

* cited by examiner

*Primary Examiner* — Scott Bauer

(57) ABSTRACT

A mixed-voltage circuit employs a higher-voltage transistor in series connection with a lower-voltage transistor. To protect the lower-voltage transistor from transient overvoltage events, a series of one or more diodes is connected between the current terminals (i.e., the source and drain terminals) of the lower-voltage transistor so as to limit the voltage across the lower-voltage transistor. This diode protection mechanism also may be provided between the gate terminal and a current terminal of the lower-voltage transistor so as to protect against an overvoltage event at the gate of the lower-voltage transistor. In this manner, the mixed-voltage circuit can provide the performance benefits of mixed use of lower-voltage and higher-voltage transistors while reducing the risk of damaging the lower-voltage transistors due to the use of the higher-voltage power supply needed for operation of the mixed-voltage circuit.

13 Claims, 3 Drawing Sheets

DIODE PROTECTION OF CASCODED MIXED-VOLTAGE TRANSISTORS

FIELD OF THE DISCLOSURE

The present disclosure relates generally to transistor-based circuits and more particularly to mixed-voltage transistor-based circuits.

BACKGROUND

As integrated circuit (IC) fabrication technology develops, there is a trend towards shrinking device size and lowering of supply voltage. Smaller, lower voltage, metal-oxide-silicon (MOS) transistors generally provide better performance for certain parameters, such as gain, noise figure, and frequency response, that are directly related to device parameters such as the transconductance parameter (Gm) and cut-off frequency ($f_T$). Exclusively using transistors designed for operation at lower voltage levels often does not provide the best overall performance, particularly when the voltage level on the output of the circuit is desired to be higher than the operational voltage of the lower voltage transistors. Accordingly, mixed-voltage circuits, which implement stacked or cascoded higher-voltage devices and lower-voltage devices, can be employed to provide a more optimal combination of sensitivity, linearity, and output voltage swing. However, transient overvoltage events resulting from, for example, a power-up or power-down event, a spike in a regulated voltage or other power supply, can disrupt the operation, or permanently damage, the more delicate lower-voltage devices in a mixed-level circuit.

BRIEF DESCRIPTION OF THE DRAWINGS

The present disclosure may be better understood, and its numerous features and advantages made apparent to those skilled in the art by referencing the accompanying drawings.

DETAILED DESCRIPTION

FIGS. 1-4 illustrate techniques for providing overvoltage protection in mixed-voltage circuits. In at least one embodiment, a mixed-voltage circuit employs a higher-voltage transistor (that is, a transistor designed for operation at a higher voltage level and having a higher damage voltage level) in series connection with a lower-voltage transistor (that is, a transistor designed for operation at a lower voltage level and having a lower damage voltage level). The series connection, in one embodiment, is implemented as a cascode arrangement whereby the higher-voltage transistor operates to improve gain, frequency response and isolation. To protect the lower-voltage transistor from transient overvoltage events, a series of one or more diodes are connected between the current terminals (i.e., the source and drain terminals) of the lower-voltage transistor so as to limit the voltage across the lower-voltage transistor. This diode protection mechanism also may be provided between the gate terminal and a current terminal of the lower-voltage transistor so as to protect against an overvoltage event at the gate of the lower-voltage transistor. In this manner, the mixed-voltage circuit can provide the performance benefits of mixed use of lower-voltage and higher-voltage transistors while reducing the risk of damaging the lower-voltage transistors due to the use of the higher-voltage power supply needed for operation of the mixed-voltage circuit.

Figure 1:
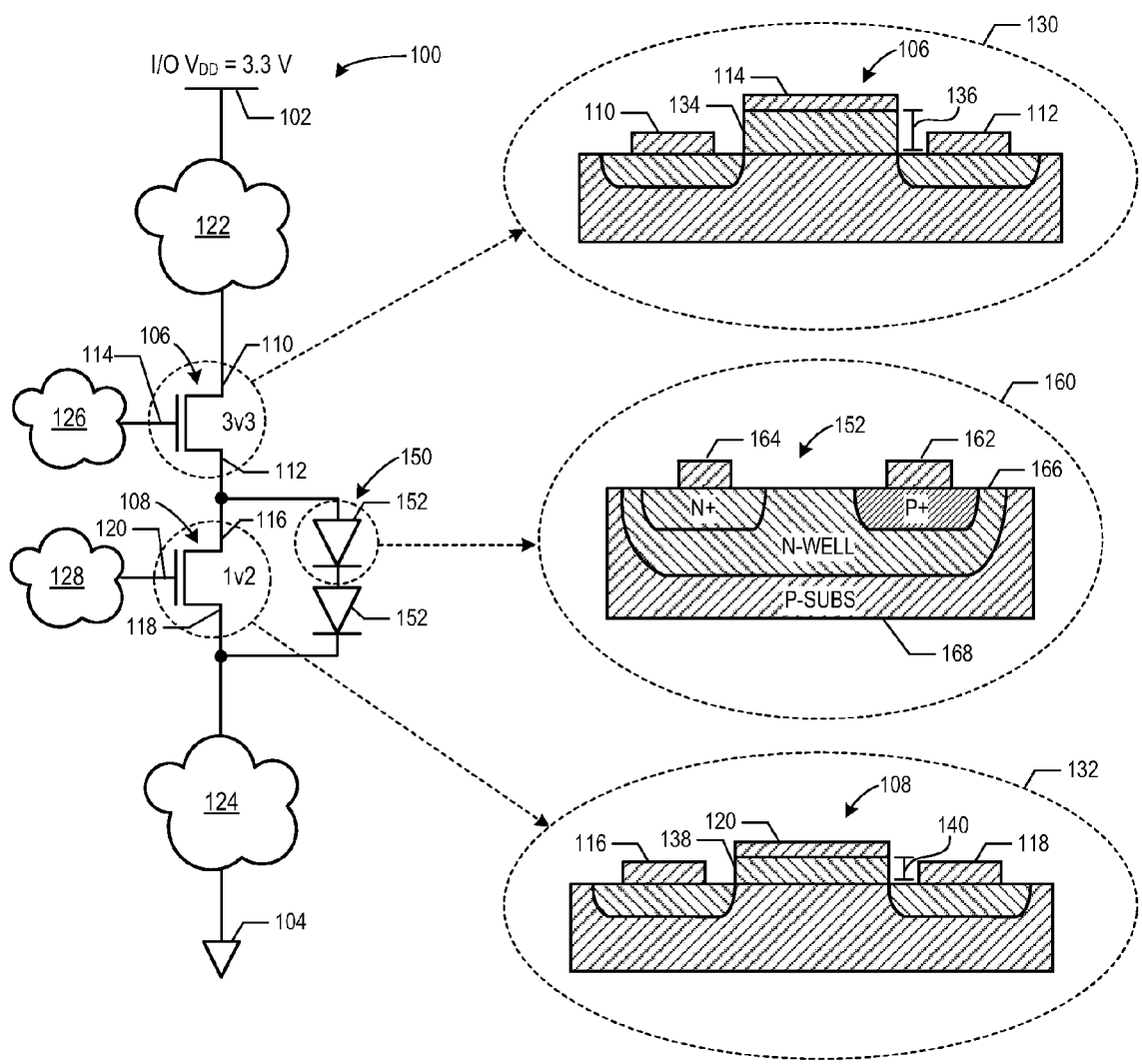
FIG. 1 is a diagram illustrating a mixed-voltage circuit employing a diode protection mechanism for a lower-voltage transistor in accordance with at least one embodiment of the present disclosure.

FIG. 1 illustrates a mixed-voltage circuit 100 employing a diode protection mechanism in accordance with at least one embodiment of the present disclosure. In the depicted embodiment, the mixed-voltage circuit 100 operates with transistors designed for different voltage domains, including a lower supply voltage (often referred to as "core voltage" or "core $V_{DD}$") and a higher supply voltage (often referred to as "input/output (I/O) voltage" or "I/O $V_{DD}$"). The circuit 100 includes a voltage rail 102 operated at a first voltage potential and a voltage rail 104 operated at a second, lower voltage potential. For example, a voltage regulator or other power supply could supply a voltage I/O $V_{DD}$ to the circuit 100, whereby the voltage rail 104 is coupled to ground (GND) and the voltage rail 102 is coupled to receive the voltage I/O $V_{DD}$. For purposes of illustration, the voltage between the voltage rails 102 and 104 is referred to herein as voltage I/O $V_{DD}$ and is described in an example context of a 3.3 volt (V) voltage supply. However, the voltage I/O $V_{DD}$ is not limited to 3.3 V, but can include any of a variety of voltages, such as 1.8 V, 2.5 V, 5 V, and the like.

The circuit 100 further includes transistors 106 and 108 coupled in series between the voltage rails 102 and 104. The transistor 106 includes current terminals 110 and 112 and gate terminal 114. The transistor 108 includes current terminals 116 and 118, and gate terminal 120. In the depicted example, the transistors 106 and 108 are n-type MOS field effect transistors (MOSFETs) and thus current terminals 110 and 116 are drain terminals and current terminals 112 and 118 are source terminals. The current terminal 110 is coupled to the voltage rail 102 either directly or via circuitry 122. The current terminal 118 is coupled to the voltage rail 104 either directly or via circuitry 124. The gate 114 is coupled to circuitry 126 and the gate 120 is coupled to circuitry 128. The circuitry 122, 124, 126, and 128 each can include one or more passive or active circuit devices connected in any of a variety of configurations. The passive or active circuit devices can include, but are not limited to, transistors, capacitors, inductors, resistive elements, and the like. In one embodiment, some or all of the circuitry 122, 124, 126, and 128 may operate at the lower supply voltage, referred to herein as voltage "core $V_{DD}$."

The transistor 106 has a design that provides a higher operational voltage level (that is, the voltage at which the transistor 106 reliably operates—also known as the "recommended" or "normal" power supply voltage), which is at least as high as I/O $V_{DD}$, and a higher damage voltage level (which typically relates to the breakdown voltage and may be identified by manufactures as an absolute maximum rating). The transistor 106 thus is referred to herein as "higher-voltage transistor 106" or an "I/O device." Conversely, the transistor 108 has a design that provides a lower operational voltage level, which is below I/O $V_{DD}$ and is at least as high as core $V_{DD}$, and a lower damage voltage level. The transistor 108 thus is referred to herein as "lower-voltage transistor 108" or "a core device." In one embodiment, the respective maximum voltage level at which the each of the transistors 106 and 108 can reliably operate is related to the gate dielectric thicknesses of the transistors, which control the corresponding gate-oxide breakdown voltages of the transistors. To illustrate, views 130 and 132 depict simplified cross-section views of the transistor 106 and the transistor 108, respectively, whereby the transistor 106 includes a gate dielectric layer 134 having a gate dielectric thickness 136 and the transistor 108 includes a gate dielectric layer 138 having a gate dielectric thickness 140. In the depicted example, the gate dielectric thickness 136 is greater than the gate dielectric thickness 140, thereby allowing the transistor 106 to reliably operate at a higher maximum voltage level than the transistor 108.

In the depicted implementation, the lower-voltage transistor 108 can operate as, for example, an amplifier circuitry or mixing circuitry for signaling received via circuitry 128, and the higher-voltage transistor 106 is biased by circuitry 126 to operate as a cascode device, thereby increasing the voltage swing or range. Thus, by stacking or cascading the transistors 106 and 108, the circuit 100 can take advantage of the relative sensitivity and response of the lower-voltage transistor 108 and the relatively-high voltage capability and linearity of the higher-voltage transistor 106. However, while the circuits 126 and 128 can be designed to reliably bias the lower-voltage transistor 108 during steady-state operation, damage could occur from transient overvoltage events that might exceed the damage voltage level of the lower-voltage transistor 108. These transient overvoltage events may occur, for example, during power-up or power-down. Accordingly, in at least one embodiment, the mixed-voltage circuit 100 employs one or more diode protection mechanisms to protect the lower-voltage transistor 108 from these transient overvoltage events.

One such diode protection mechanism includes a series 150 of one or more diodes 152 connected in series between the current terminals 116 and 118 of the transistor 108, whereby the first diode 152 of the series 150 has an anode coupled to the higher-potential current terminal (e.g., the drain terminal 116 in the n-type FET example depicted) and the last diode 152 of the series has a cathode coupled to the lower-potential current terminal (e.g., the source terminal 116 in the n-type FET example depicted). Each diode 152 has a corresponding forward voltage drop ($V_d$) when forward biased, and thus the total voltage drop ($V_{d\_T}$) across the series 150 is the sum of the individual forward voltage drops of the diodes 152. The voltage drop $V_d$ typically is around 0.6 V-0.7 V for most p-n junction diodes, but can range widely depending on diode architecture and material.

As illustrated by view 160, the diodes 152 can be implemented as "diodep"-type diodes, also called a P+/Nwell diodes, with both the p-type doped anode terminal 162 and the n-type doped cathode terminal 164 are positioned in an N-doped well (Nwell) 166 formed in the substrate 168. This configuration allows voltages on both the anode terminal 162 and the cathode terminal 164 to be floating with respect to substrate GND.

The diode protection mechanism operates to protect the transistor 108 from an overvoltage event by forward biasing, or "turning on," the diodes 152 of the series 150 so as to redirect overload current through the diodes 152 and thus maintain the drain-source voltage ($V_{DS}$) of the transistor 108 at an acceptable level. Thus, in one embodiment, the number of diodes 152 implemented in the series 150 is selected so that the total voltage drop $V_{d\_T}$ of the series 150 is greater than the expected operating voltage across the current terminals 116, 118 ($V_{DS}$) of the transistor 108 and less than the drain-to-source damage voltage level expected to disrupt or damage the transistor 108. To illustrate, assume that the supply voltage core $V_{DD}$ is 1.2 V and the transistor 108 has a gate oxide thickness that limits the operational voltage of the transistor 108 to 1.5 V, and that the transistor 108 is to be protected from any voltage greater than 1.5 V (specified, for example, as an absolute maximum rating by a manufacturer or provider of the device implementing the circuit 100). Further assume that the voltage drop $V_d$ of each diode 152 is 0.65 V. To provide overvoltage protection starting at 1.3 V, the series 150 is implemented with two diodes 152 in series in this scenario (1.3 V=2 diodes*0.65 V drop/diode). As described in greater detail below, a similar diode protection mechanism may be implemented at the gate terminal 120 of the lower-voltage transistor 108 to protect the transistor 108 from overvoltage events between the gate terminal 120 and the source terminal 118 that exceed the gate-to-source damage voltage level of the lower-voltage transistor 108.

Figure 2:
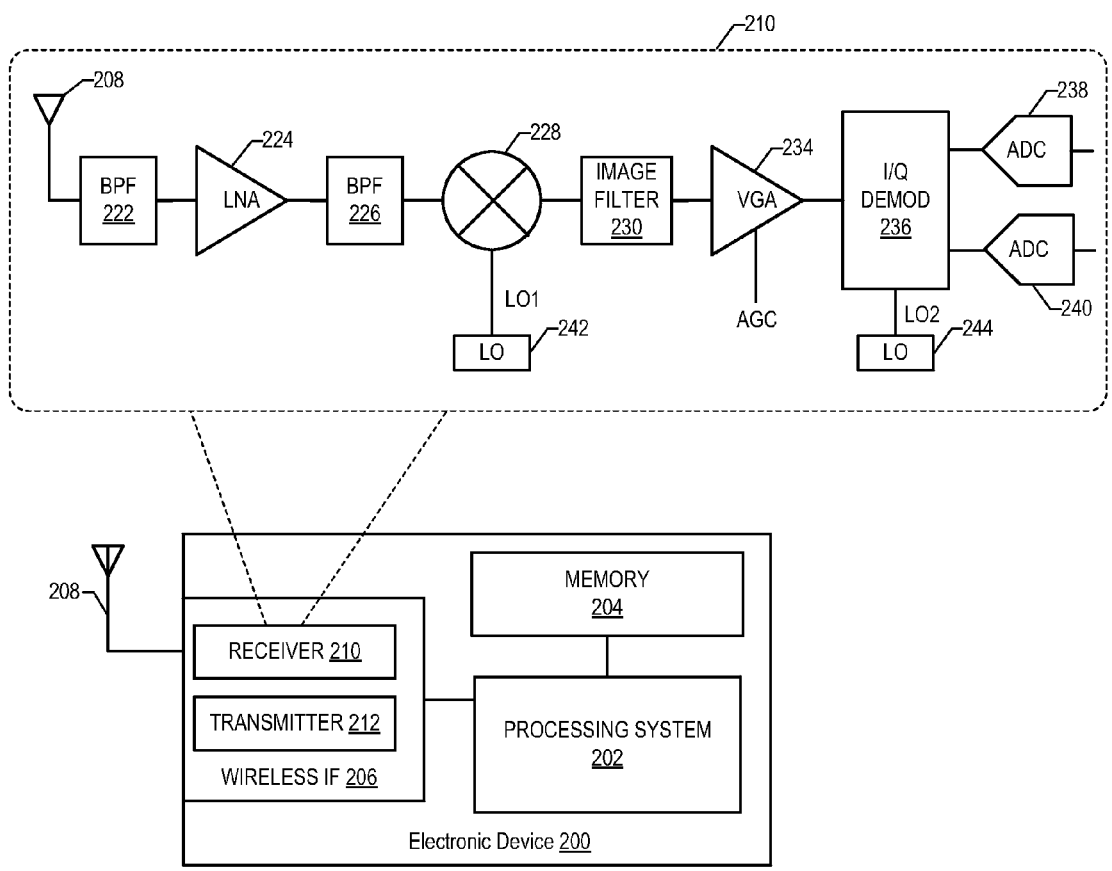
FIG. 2 is a diagram illustrating an electronic device implementing mixed-voltage circuits with diode protection in accordance with at least one embodiment of the present disclosure.

FIG. 2 illustrates an example electronic device 200 which advantageously utilizes various implementations of the mixed-voltage circuit 100 of FIG. 1 in accordance with at least one embodiment of the present disclosure. The electronic device 200 can include any of a variety of electronic devices implementing integrated circuits to perform any of a variety of functions, such as receiving, amplifying, mixing, filtering, or driving signals. In the depicted example, the electronic device 200 comprises a wireless device comprising a processing system 202, a memory 204, a wireless interface, or transceiver, 206, and an antenna 208. The wireless interface 206 includes a radio frequency (RF) receiver 210 and an RF transmitter 212. The processing system 202 can include one or more processors to process data for transmission via the RF transmitter 212 or process data received via the RF receiver 210 in accordance with, for example, software stored in the memory 204 and executed by one or more processing elements of the processing system 202. The processing elements can include, for example, a central processing unit, a graphics processing unit, an application specific integrated circuit, a digital signal processor, and the like.

Also depicted in FIG. 2 is an example implementation of the RF receiver as a super heterodyne receiver comprising a bandpass filter (BPF) 222, a low-noise amplifier (LNA) 224, a BPF 226, a mixer 228, an image filter 230, a variable gain amplifier (VGA) 234, an I/Q demodulator 236, analog-to-digital converters 238 and 240, and local oscillators 242 and 244. The diode protection mechanisms described herein can be implemented in some or all of these circuit components to as to provide the necessary voltage range and linearity associated with I/O $V_{DD}$ while also providing the desired noise, gain and frequency response of devices typically associated with core $V_{DD}$.

Figure 3:
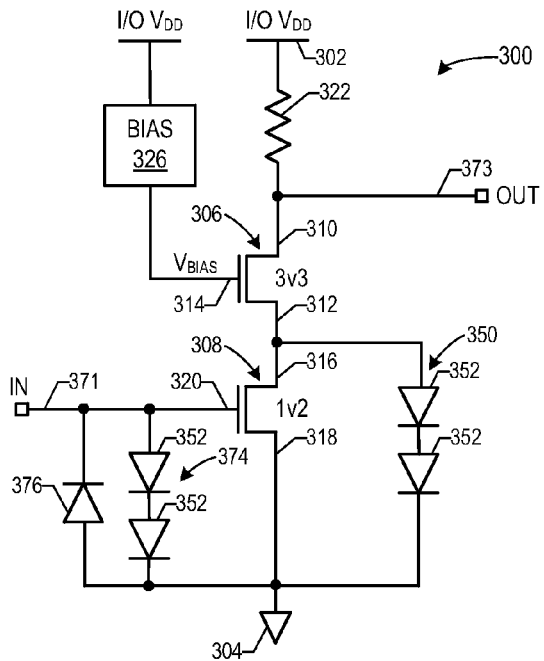
FIG. 3 is a diagram illustrating an example mixed-voltage low-noise amplifier (LNA) circuit implementing diode protection mechanisms in accordance with at least one embodiment of the present disclosure.

FIG. 3 illustrates an example amplifier circuit 300 employing diode protection mechanisms for lower-voltage transistors in accordance with at least one embodiment of the present disclosure. The amplifier circuit 300 can be implemented in, for example, the LNA 224 or the variable gain amplifier 234 of the electronic device 200 of FIG. 2, or in a corresponding amplifier component of the RF transmitter 212 of the electronic device 200. The amplifier circuit 300 is depicted in FIG. 3 as a single-ended-input/single-ended-output configuration for ease of illustration. It will be appreciated that the implementation described herein can be readily adapted to a differential-input/differential-output implementation using the teachings provided herein.

The amplifier circuit 300 includes voltage rails 302 and 304 (corresponding to voltage rails 102 and 104 of FIG. 1), higher-voltage transistor 306 and lower-voltage transistor 308 (corresponding to transistors 106 and 108, respectively), a resistive element 322 (corresponding to the circuitry 122 of FIG. 1), and a bias circuit 326 (corresponding to circuitry 126 of FIG. 1), an input terminal 371 to receive an input signal and an output terminal 373 to output an amplified output signal. The voltage rails 302 and 304 receive the supply voltage I/O $V_{DD}$. The resistive element 322 may comprise a resistor, a diode-coupled transistor, current source and the like, and includes a terminal coupled to the voltage rail 302 and a terminal coupled to the output terminal 373. The transistor 306 includes a current terminal 310 coupled to the output terminal 373, a current terminal 312, and a gate terminal 314. The transistor 308 includes a current terminal 316 coupled to the current terminal 312, a current terminal 318 coupled to the voltage rail 304 (i.e., coupled to GND), and a gate terminal 320 coupled to the input terminal 371. The bias circuit 326 includes a terminal coupled to the voltage rail 302 and a terminal coupled to the gate 314 of the transistor 306, whereby the bias circuit 326 generate a bias voltage $V_{BIAS}$ at the gate electrode 314 of the transistor 306 so as to bias the transistor 306.

The amplifier circuit 300 further includes a $V_{DS}$ diode protection mechanism between the current terminals of the transistor 308. This diode protection mechanism comprises a series 350 of diodes 352 coupled in series between the current terminal 316 and the current terminal 318 (which, in turn, is coupled to GND). In the depicted example, the transistor 308 is susceptible to damage at $V_{DS}$ voltages above 1.5 V, and thus the series 350 includes two diodes 352 for a total voltage drop $V_{d\_T}$ of 1.3 V (assuming an individual voltage drop $V_d$ of 0.65V). The amplifier circuit 300 further includes another diode protection mechanism for the gate-source voltage ($V_{GS}$) of the transistor 308. The $V_{GS}$ diode protection mechanism including a series 374 of diodes 352 coupled in series between the gate terminal 320 and the gate terminal 318. As with the $V_{DS}$ diode protection, the number of diodes 352 in the series 374 is based on the voltage drop of the diodes 352 and the operational voltage $V_{GS}$ of the transistor 308. The $V_{GS}$ diode protection mechanism further includes a diode 376 comprising a cathode coupled to the gate terminal 316 and the input terminal 371 and an anode coupled to the current terminal 318 and the cathode of the last diode 352 in the series 350 (that is, coupled to GND). In one embodiment, the diode 376 is a "dioden"-type diode (N+ diode with P+ connection to substrate GND). The diode 376 operates to limit the voltage of reverse polarity in the event of a very large input signal AC coupled to the gate terminal 320 going below zero volts on the negative side of the waveform cycle.

Figure 4:
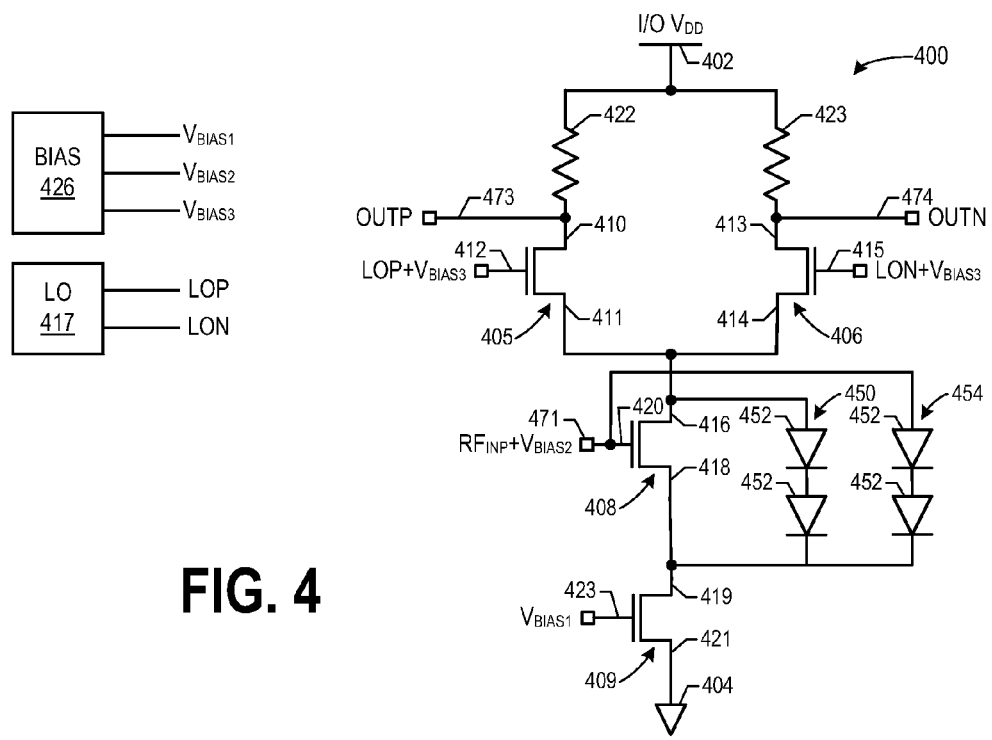
FIG. 4 is a diagram illustrating an example mixed-voltage mixer circuit implementing diode protection mechanisms in accordance with at least one embodiment of the present disclosure.

FIG. 4 illustrates an example mixer circuit 400 employing diode protection mechanisms for lower-voltage transistors in accordance with at least one embodiment of the present disclosure. The mixer circuit 400 can be implemented in, for example, the mixer 228 or the I/Q demodulator 236 of the electronic device 200 of FIG. 2. The mixer circuit 400 is depicted in FIG. 4 as a single-ended-input/differential output configuration for ease of illustration. It will be appreciated that the implementation described herein is readily adapted to a differential-input/differential-output implementation using the teachings provided herein.

The mixer 400 includes voltage rails 402 and 404 (corresponding to voltage rails 102 and 104 of FIG. 1), higher-voltage transistors 405 and 406 (corresponding to transistor 106 of FIG. 1), a lower-voltage transistor 408 (corresponding to transistor 108 of FIG. 1), a higher-voltage transistor 409, resistive elements 422 and 423 (corresponding to the circuitry 122 of FIG. 1), and a bias circuit 426 (corresponding to circuitry 126 of FIG. 1), single-ended input terminal 471 to receive a single-ended input signal and differential output terminals 473 and 474 to output an amplified differential output signal.

The voltage rails 402 and 404 receive the supply voltage I/O $V_{DD}$. The resistive elements 422 and 423 may comprise resistors, diode-coupled transistors, current sources and the like, and each includes a terminal coupled to the voltage rail 402 and a terminal coupled to a corresponding output terminal and a current terminal of a corresponding one of the transistors 405, 406. The transistor 405 includes a current terminal 410 coupled to the resistive element 422 and the output terminal 473, a current terminal 411, and a gate terminal 412 to receive an input representing the sum of the positive output LOP of a local oscillator (LO) 417 and a bias voltage $V_{BIAS3}$ from the bias circuit 426. The transistor 406 includes a current terminal 413 coupled to the resistive element 423 and the output terminal 474, a current terminal 414, and a gate terminal 415 to receive an input representing the sum of the negative output LON of the LO 417 and the bias voltage $V_{BIAS3}$.

The transistor 408 includes a current terminal 416 coupled to the current terminals 411 and 414, a current terminal 418, and a gate terminal 420 coupled to the input terminal 471 to receive an input signal representing a sum of an input RF signal and a bias voltage $V_{BIAS2}$ from the bias circuitry 426. The transistor 409 includes a current terminal 419 coupled to the current terminal 418, a current terminal 421 coupled to the voltage rail 404 (that is, to GND), and a gate terminal 423 to receive a bias voltage $V_{BIAS}$ from the bias circuit 426.

The mixer circuit 400 includes a $V_{DS}$ diode protection mechanism and a $V_{GS}$ diode protection mechanism. The $V_{DS}$ diode protection mechanism comprises a series 450 of diodes 452 coupled in series between the current terminal 416 and the current terminal 418. The $V_{GS}$ diode protection mechanism comprises a series 454 of diodes 452 coupled in series between the gate terminal 420 and the current terminal 418. The $V_{GS}$ diode protection mechanism further may also include a "dioden"-type diode (not shown) to limit the voltage of reverse polarity in the event of a very large input signal AC coupled to the gate terminal 420 going below zero volts on the negative side of the waveform cycle as similarly described above with respect to the amplifier circuit 300 of FIG. 3.

In operation, the bias circuit 426 references voltage $V_{BIAS2}$ and $V_{BIAS3}$ to I/O $V_{DD}$ such that as I/O $V_{DD}$ goes up or down within design tolerances. In the event that I/O $V_{DD}$ increases, the voltage across the transistor 408 remains approximately constant while the voltage across the transistor 409 increases. However, transients on I/O $V_{DD}$ greater than design tolerances, or transients in the input RF signal or voltages $V_{BIAS2}$ or $V_{BIAS3}$ can result in overvoltage events, which the transistor 408 is protected from by the $V_{DS}$ diode protection mechanism and $V_{GS}$ diode protection mechanism.

Although FIGS. 1, 3, and 4 illustrate circuits employing diode protection for n-type transistors, the present disclosure is not limited to such implementations, but instead is intended to also cover diode protection for p-type transistors with the appropriate logic inversions as would be consistent with the teachings provided herein. Further, although FIGS. 3 and 4 illustrate example circuit implementations, the present disclosure is not limited to these examples, but rather can include any of a variety of mixed-voltage circuits that employ a cascoding, or stacking, of higher-voltage transistors and lower-voltage transistors and in which the lower-voltage transistor is therefore susceptible to transient overvoltage events. Such mixed-voltage circuits are frequency found in RF and analog applications, and examples of such circuits which may advantageously employ the diode protection mechanisms disclosed herein include, but are not limited to, local oscillator circuits, mixers, low-noise amplifiers, operational amplifiers, power amplifiers, sample-and-hold amplifiers, line drivers, and the like.

In accordance with one aspect of the present disclosure, a circuit comprises a first transistor comprising a first current terminal, a second current terminal, and a gate terminal, the first transistor having a first operational voltage level, and further comprises a second transistor comprising a first current terminal, a second current terminal, and a gate terminal, the first current terminal of the second transistor coupled to the second current terminal of the first transistor, the second transistor having a second operational voltage level lower than the first operational voltage level. The circuit also includes a first series of one or more diodes connected in series between the first current terminal and the second current terminal of the second transistor, a first diode of the first series having an anode terminal coupled to the first current terminal of the second transistor and a last diode of the first series having a cathode terminal coupled to the second current terminal of the second transistor. In one embodiment, the first transistor comprises a gate dielectric having a first thickness and the second transistor comprises a gate dielectric having a second thickness less than the first thickness. Further, at least one diode of the first series can comprise a P+/N-well diode. In one aspect, a cumulative voltage drop of the first series of one or more diodes when forward biased is greater than the second operational voltage level and less than a damage voltage level of the second transistor.

In one embodiment, the circuit may further comprising a second series of one or more diodes connected between the gate terminal of the second transistor and the second current terminal of the second transistor, a first diode of the second series having an anode terminal coupled to the gate terminal of the second transistor and a last diode of the second series having a cathode terminal coupled to the second current terminal of the second transistor. The circuit may be implemented as, for example, an amplifier or mixer circuit.

In accordance with another aspect of the present disclosure, a circuit comprises a first transistor comprising a first current terminal, a second current terminal, and a gate terminal, the first transistor having a first operational voltage level, and comprises a second transistor comprising a first current terminal, a second current terminal, and a gate terminal, the first current terminal of the second transistor coupled to the second current terminal of the first transistor, the second transistor having a second operational voltage level lower than the first operational voltage level. The circuit further comprises a first series of one or more diodes connected in series between the gate terminal and the second current terminal of the second transistor, a first diode of the first series having an anode terminal coupled to the gate terminal of the second transistor and a last diode of the first series having a cathode terminal coupled to the second current terminal of the second transistor. In one embodiment, the first transistor comprises a gate dielectric having a first thickness, and the second transistor comprises a gate dielectric having a second thickness less than the first thickness. At least one diode of the first series may comprises a P+/N-well diode. A cumulative voltage drop of the first series of one or more diodes when forward biased can be greater than the second operational voltage level and less than a damage voltage level of the second transistor. Further, in one embodiment, the circuit also comprises a diode connected between the gate terminal of the second transistor and the second current terminal of the second transistor, the diode having an anode terminal coupled to the second current terminal of the second transistor and a cathode terminal coupled to the gate terminal of the second transistor.

In accordance with yet another aspect of the present disclosure, a method includes providing a circuit comprising a first transistor comprising a first current terminal, a second current terminal, and a gate terminal, the first transistor having a first operational voltage level, a second transistor comprising a first current terminal, a second current terminal, and a gate terminal, the first current terminal of the second transistor coupled to the second current terminal of the first transistor, and the second transistor having a second operational voltage level lower than the first operational voltage level, and a first series of one or more diodes connected in series between the first current terminal and the second current terminal of the second transistor, a first diode of the first series having an anode terminal coupled to the first current terminal of the second transistor and a last diode of the first series having a cathode terminal coupled to the second current terminal of the second transistor. The method further includes operating the circuit at a first time such that a voltage difference between the first current terminal and the second current terminal of the second transistor is not greater than the second voltage level. In one embodiment, a cumulative voltage drop over the series of one or more diodes when the series of one or more diodes are forward biased is greater than the second operational voltage level and less than the first operational voltage level. The method further can include operating the circuit at a second time such that the voltage difference is greater than the second operational voltage level, and, in response to the voltage difference being greater than the second voltage level, forward biasing the first series of one or more diodes to protect the second transistor. In one embodiment, providing the circuit comprises providing the first transistor with a gate dielectric having a first thickness and providing the second transistor with a gate dielectric having a second thickness less than the first thickness.

In this document, relational terms such as "first" and "second", and the like, may be used solely to distinguish one entity or action from another entity or action without necessarily requiring or implying any actual relationship or order between such entities or actions or any actual relationship or order between such entities and claimed elements. The term "another", as used herein, is defined as at least a second or more. The terms "including", "having", or any variation thereof, as used herein, are defined as comprising.

Other embodiments, uses, and advantages of the disclosure will be apparent to those skilled in the art from consideration of the specification and practice of the disclosure disclosed herein. The specification and drawings should be considered as examples only, and the scope of the disclosure is accordingly intended to be limited only by the following claims and equivalents thereof.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A circuit comprising:
    a first transistor comprising a first current terminal, a second current terminal, and a gate terminal, the first transistor having a first operational voltage level and the first current terminal coupled to an output terminal to provide an output signal;
    a second transistor comprising a first current terminal, a second current terminal, and a gate terminal, the first current terminal of the second transistor coupled to the second current terminal of the first transistor, the second transistor having a second operational voltage level lower than the first operational voltage level and the gate terminal coupled to an input terminal to receive an input signal;
    a first series of one or more diodes connected in series between the first current terminal and the second current terminal of the second transistor, a first diode of the first series having an anode terminal coupled to the first current terminal of the second transistor and a last diode of the first series having a cathode terminal coupled to the second current terminal of the second transistor;
    a second series of one or more diodes connected between the gate terminal of the second transistor and the second current terminal of the second transistor, a first diode of the second series having an anode terminal coupled to the gate terminal of the second transistor and a last diode of the second series having a cathode terminal coupled to the second current terminal of the second transistor; and
    a third series of one or more diodes connected between the gate terminal of the second transistor and the second current terminal of the second transistor, a first diode of the third series having an anode terminal coupled to second current terminal of the second transistor and a last diode of the third series having a cathode terminal coupled to the gate terminal of the second transistor.

2. The circuit of claim 1, wherein:
    the first transistor comprises a gate dielectric having a first thickness; and
    the second transistor comprises a gate dielectric having a second thickness less than the first thickness.

3. The circuit of claim 1, wherein at least one diode of the first series comprises a P+/N-well diode.

4. The circuit of claim 1, wherein a cumulative voltage drop of the first series of one or more diodes when forward biased is greater than the second operational voltage level and less than a damage voltage level of the second transistor.

5. An electronic device implementing the circuit of claim 1.

6. The electronic device of claim 5, wherein the electronic device comprises a wireless interface implementing the circuit.

7. An amplifier circuit comprising the circuit of claim 1.

8. A mixer circuit comprising the circuit of claim 1.

9. The circuit of claim 1, wherein the first operational voltage level is approximately 3.3 volts and the second operational voltage level is approximately 1.2 volts.

10. A method comprising:
    providing a circuit comprising a first transistor comprising a first current terminal coupled to an output terminal for providing an output signal, a second current terminal, and a gate terminal, the first transistor having a first operational voltage level, a second transistor comprising a first current terminal, a second current terminal, and a gate terminal coupled to an input terminal to receive an input signal, the first current terminal of the second transistor coupled to the second current terminal of the first transistor, and the second transistor having a second operational voltage level lower than the first operational voltage level, and a first series of one or more diodes connected in series between the first current terminal and the second current terminal of the second transistor, a first diode of the first series having an anode terminal coupled to the first current terminal of the second transistor and a last diode of the first series having a cathode terminal coupled to the second current terminal of the second transistor, the circuit further comprising a second series of one or more diodes connected between the gate terminal of the second transistor and the second current terminal of the second transistor, a first diode of the second series having an anode terminal coupled to the gate terminal of the second transistor and a last diode of the second series having a cathode terminal coupled to the second current terminal of the second transistor; and the circuit further comprising a third series of one or more diodes connected between the gate terminal of the second transistor and the second current terminal of the second transistor, a first diode of the third series having an anode terminal coupled to second current terminal of the second transistor and a last diode of the third series having a cathode terminal coupled to the gate terminal of the second transistor; and
    operating the circuit at a first time such that a voltage difference between the first current terminal and the second current terminal of the second transistor is not greater than the second voltage level.

11. The method of claim 10, wherein a cumulative voltage drop over the series of one or more diodes when the series of one or more diodes are forward biased is greater than the second operational voltage level and less than the first operational voltage level.

12. The method of claim 11, further comprising:
    operating the circuit at a second time such that the voltage difference is greater than the second operational voltage level; and
    in response to the voltage difference being greater than the second voltage level, forward biasing the first series of one or more diodes to protect the second transistor.

13. The method of claim 10, wherein providing the circuit comprises providing the first transistor with a gate dielectric having a first thickness and providing the second transistor with a gate dielectric having a second thickness less than the first thickness.

* * * * *